United States Patent [19]
Wheater

[11] Patent Number: 6,073,258
[45] Date of Patent: Jun. 6, 2000

[54] METHOD AND DEVICE FOR PERFORMING TWO DIMENSIONAL REDUNDANCY CALCULATIONS ON EMBEDDED MEMORIES AVOIDING FAIL DATA COLLECTION

[75] Inventor: Donald L. Wheater, Hinesburg, Vt.

[73] Assignee: International Business Machines Corporation, Armonk, N.Y.

[21] Appl. No.: 09/032,451

[22] Filed: Feb. 27, 1998

[51] Int. Cl.[7] .................................................. G01R 31/28
[52] U.S. Cl. .......................................................... 714/718
[58] Field of Search .................................... 714/710, 711, 714/718, 719, 723, 763, 764, 5, 7, 42; 711/166, 159, 133; 364/970, 970.1, 245.3; 365/200, 201, 226, 225.7, 242

[56] References Cited

U.S. PATENT DOCUMENTS

| | | | |
|---|---|---|---|
| 3,755,791 | 8/1973 | Arzubi | 365/200 |
| 4,460,997 | 7/1984 | Harns | 714/711 |
| 4,586,178 | 4/1986 | Bosse | 714/711 |
| 4,639,915 | 1/1987 | Bosse | 714/711 |
| 4,751,656 | 6/1988 | Conti et al. | 714/711 |
| 5,313,424 | 5/1994 | Adams et al. | 365/200 |
| 5,317,573 | 5/1994 | Bula et al. | 714/711 |
| 5,442,641 | 8/1995 | Beranger et al. | 714/711 |
| 5,677,884 | 10/1997 | Zagar et al. | 365/200 |
| 5,706,238 | 1/1998 | Cutter et al. | 365/225.7 |
| 5,835,504 | 11/1998 | Balkin et al. | 714/723 |
| 5,838,620 | 11/1998 | Zagar et al. | 365/200 |

*Primary Examiner*—Christine Tu
*Attorney, Agent, or Firm*—William N. Hogg

[57] ABSTRACT

A method and device for performing two dimensional redundancy determinations on embedded memories is provided. The method and device permit the calculation and implementation of two-dimensional redundancy without saving a failure map of the memory being tested. The method and device dynamically determines whether any failed memory cells are present within the array and attempts to repair the cells. Two logic procedures are implemented: a "must fix" word and bit line procedure and a "single cell" repair procedure. The "must fix" word and bit line procedure counts the number of failed first dimensional memory components (i.e., bit lines or word lines) along a second dimensional memory component (i.e., word line or bit line). If the number of failed memory elements is greater than the number of redundant first dimensional components, a redundant second dimensional component is soft-fused in placed of the second dimensional memory component. The "single cell" repair procedure attempts to repair any failed single memory cells by soft-fusing redundant word or bit lines for the failed single memory cell's word or bit line, as appropriate.

20 Claims, 5 Drawing Sheets

METHOD AND DEVICE FOR PERFORMING TWO DIMENSIONAL REDUNDANCY CALCULATIONS ON EMBEDDED MEMORIES AVOIDING FAIL DATA COLLECTION

FIELD OF THE INVENTION

The invention relates generally to the testing of embedded memories, and more particularly, to methods and devices for performing dynamic, on-chip, two-dimensional redundancy calculations on embedded memory circuits having electronic steering (i.e., "blowable" electronic fuses) of redundant memory elements.

BACKGROUND OF THE INVENTION

The testing of memory circuits is important because even the slightest irregularities in raw materials and manufacturing processes may result in memory circuits which have one or more defective or failed memory elements. In order to provide a method of repairing such defective memories to improve yields, designers have developed memories which include redundant elements and circuitry for replacing the defective elements with redundant elements. Redundant elements typically include word line(s), bit line(s), or combinations of both, which are not initially assigned to any memory element(s) in the memory. While the testing of stand-alone memories in conventional Single-Inline Memory Modules (SIMMs) and Dual-Inline Memory Modules (DIMMs) is relatively straight forward, the testing of "embedded" memories poses special problems.

In particular, many circuits chips such as, for example, microprocessors, micro-controllers, and digital signal processors, have "embedded" memories. Embedded memories pose a special problem to testers because of their embedded design, i.e., they are surrounded by other circuits and logic. Accordingly, they are more difficult to test than their stand-alone counterparts because these circuit chips have fewer input and output pins available for the testing of their embedded memories. One attempt at overcoming this limitation is to include memory Array Built In Self-Test (hereinafter ABIST) circuitry within the chip. Generally, ABIST circuitry generates a plurality of test vectors which are applied (i.e., written) to the memory array. The ABIST then reads the output of the memory array and compares it with an expected result based on the applied test vectors to determine whether or not the test was successful.

To repair defective memory elements, single (i.e., word line or bit line) or two-dimensional (i.e., word line and bit line) redundancy calculations may be performed to determine where the redundant elements should be substituted. Two-dimensional redundancy calculations typically have the following general steps. Firstly, the redundant elements are tested to establish that they themselves are useable. Secondly, the memory array is tested and a "fail" image of the entire memory array is generated. The "fail" image identifies failed and good memory elements. Thirdly, post-processing of the "fail" image is performed to determine the best repair method for the image (i.e., where the redundant elements should be substituted). Once the best repair method is determined, the redundant elements are typically laser-fused into place.

The above-described general method of performing two-dimensional redundancy calculations is disadvantageous for several reasons. Firstly, it is very time-consuming because it requires separate testing of redundant elements and actual memory array elements. Secondly, the process is inefficient because it requires the generation and storage of large of amounts of test fail data so that a "fail" image of the entire memory can be generated. Thirdly, post-processing of the "fail" image to determine the best repair method for the memory is time-consuming and requires sophisticated external testing equipment. Accordingly, an apparatus and method which does not suffer from the above mentioned disadvantages is desirable. The second and third reasons are especially disadvantageous from an on-chip BIST viewpoint.

SUMMARY OF THE INVENTION

According to one aspect of the present invention, A method for performing dynamic, two-dimensional redundancy determinations to test and repair a memory array without the collection of significant amounts of fail data is provided. The memory array has a plurality of first and second dimensional memory components and plurality of redundant first and second dimensional memory components.

The method includes, for example, the steps of: determining the number of failed first dimensional memory components having a particular second dimensional memory component; determining whether the number of failed first dimensional memory components is greater than the number of redundant first dimensional memory components; if the number of failed first dimensional memory components is greater than the number of redundant first dimensional memory components, then soft-fusing a redundant second dimensional memory component for the particular second dimensional memory component; determining the number of failed second dimensional memory components having a particular first dimensional memory component; determining whether the number of failed second dimensional memory components is greater than the number of redundant second dimensional memory components; and if the number of failed second dimensional memory components is greater than the number of redundant second dimensional memory components, then soft-fusing a redundant first dimensional memory component for the particular first dimensional memory component.

According to another embodiment of the present invention, a method for performing dynamic, two-dimensional redundancy determinations to test and repair a memory array having a plurality of first and second dimensional memory components and a plurality of redundant first and second dimensional memory components is provided.

The method has, for example, the following steps: generating vector test data which corresponds to an expected memory array output; applying the vector test data to the memory array; reading memory array output data which is associated with the applied vector test data; determining if a fail memory cell is present in the memory array by comparing the expected memory array output with the read memory array output; if a fail memory cell is present, identifying first and second dimensional memory components of the fail memory cell; determining if a redundant first dimensional component is available; if a redundant first dimensional component is available, replacing the identified first dimensional component with a redundant first dimensional component; if a redundant first dimensional component is not available, determining if a redundant second dimensional component is available; and if a redundant second dimensional component is available, replacing the identified second dimensional component with a redundant second dimensional component.

Another embodiment of the present invention provides a memory device for use in a computer. The memory device includes, for example, a plurality of memory cells having a plurality of first and second dimensional memory components, a plurality of redundant first and second dimensional memory components, and dynamic, two-dimensional redundancy logic for testing and repairing the plurality of memory cells. The two-dimensional redundancy logic includes, for example, logic for determining the number of failed first dimensional memory components having a particular second dimensional memory component, logic for determining whether the number of failed first dimensional memory components is greater than the number of redundant first dimensional memory components, logic for soft-fusing a redundant second dimensional memory component for the particular second dimensional memory component if the number of failed first dimensional memory components is greater than the number of redundant first dimensional memory components, logic for determining the number of failed second dimensional memory components having a particular first dimensional memory component, logic for determining whether the number of failed second dimensional memory components is greater than the number of redundant second dimensional memory components; and logic for soft-fusing a redundant first dimensional memory component for the particular first dimensional memory component if the number of failed second dimensional memory components is greater than the number of redundant second dimensional memory components.

It is, therefore, an advantage of the present invention to provide for the dynamic calculation of a redundancy solution for a memory without collecting fail data for the entire memory.

It is a further advantage of this invention to provide a method of on-chip repair during test pattern execution without collecting fail data for the entire memory.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF ILLUSTRATED EMBODIMENT

Figure 1:
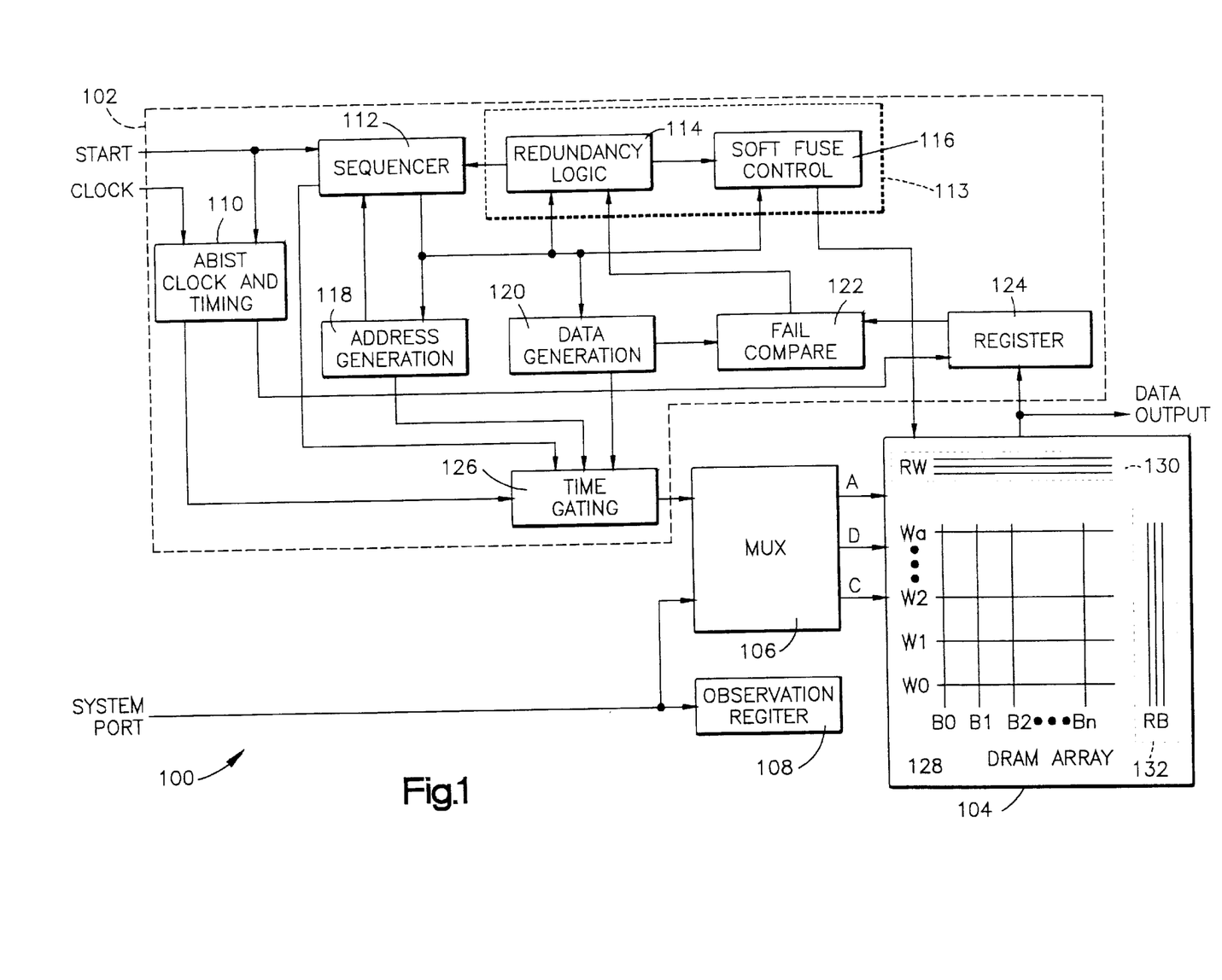
FIG. 1 is block diagram illustrating various components of the present invention.

Referring now to FIG. 1, a DRAM circuit 100 of the present invention is shown. The DRAM circuit 100 has an ABIST circuit 102, DRAM array 104, multiplexer 106, and Observation register 108. The ABIST circuit 102 has a Clock and Timing circuit 110, Sequencer 112, Redundancy Calculation circuitry 113, Address and Data Generation circuitry 118 and 120, Fail Compare circuit 122, Time Gating circuit 126, and Register 124. With the exception of the Redundancy Calculation circuitry 113, the aforementioned elements are all of conventional ABIST technology. The DRAM array 104 has a memory array 128, a plurality of redundant word RW lines 130, and a plurality of redundant bit RB lines 132. The memory array 128 has a plurality of word lines $W_0$ to $W_n$ and a plurality of bit lines $B_0$ to $B_m$, where "n" and "m" can be any desired integer value. The System Port input to multiplexer 106 and Observation register 108 includes address, data, and control signals from a main processing unit.

The Redundancy Calculation circuit 113 has Redundancy Logic 114 and Soft Fuse Control logic 116. As will be described in more detail hereinafter, the Redundancy Logic 114 functions primary to perform two-dimensional redundancy calculations. The Soft Fuse Control Logic 114 functions primarily to control the setting of electronic fuses under direction of the Redundancy Logic 114 which steers the redundant elements in place of defective memory elements. In the preferred embodiment, the fuse element is a transistor which is either latched to an "open" state or a "closed" (i.e., fused) state. As will be described in more detail hereinafter, the fuse elements are responsible for "soft-fusing" redundant memory elements into the memory array. The term "soft-fusing" is hereby defined to mean that the fuse elements may be set and reset via an electronic signal means, as opposed to "hard-fusing" or "laser-fusing" wherein the fuse elements are not capable of being reset. For more information on electronic fuses, see U.S. Pat. No. 3,755,791 to Arzubi, which is hereby incorporated by reference.

The present invention performs two-dimensional redundancy calculations on a memory array to detect and repair failed memory elements without collecting fail data for the entire memory. The two-dimensions are defined as word line and bit line dimensions. The two-dimensional Redundancy Logic 114 has "must fix" word and bit line logic and "single cell" repair logic. The logic is preferably implemented as executable microcode within the Redundancy Logic 114 and Soft Fuse Control Logic 116. As will be described in more detail hereinafter, the "must fix" word and bit logic attempts to replace word or bit lines which have more failed elements than available redundant elements. For example, if the number of failed bit lines in a particular word line is greater than the available number of redundant bit lines, a redundant word line is soft-fused in place of the present word line. Similarly, if the number of failed word lines in a particular bit line is greater than the available number of redundant word lines, a redundant bit line is soft-fused in place of the present bit line. This is done with an address sequence that proceeds unidirectionally along either the bit or word line (incrementing or decrementing). If a "must fix" is encountered then the defective line is replaced immediately and then tested—avoiding collection of fail data for the entire array. This differs from existing methods by avoiding collection of significant amounts of fail data and processing afterwards. Once the "must fix" word and bit line logic procedure has been successfully applied, the Redundancy Logic 114 applies the "single cell" repair logic. In the "single cell" repair logic, any detected single memory cell failures are repaired by soft-fusing the remaining redundant word and bit lines, as appropriate, for the failed word or bit line of that particular memory cell. In this operation, defective cells are replaced immediately and the array retested, allowing complex address sequences to be executed.

Figure 2A:
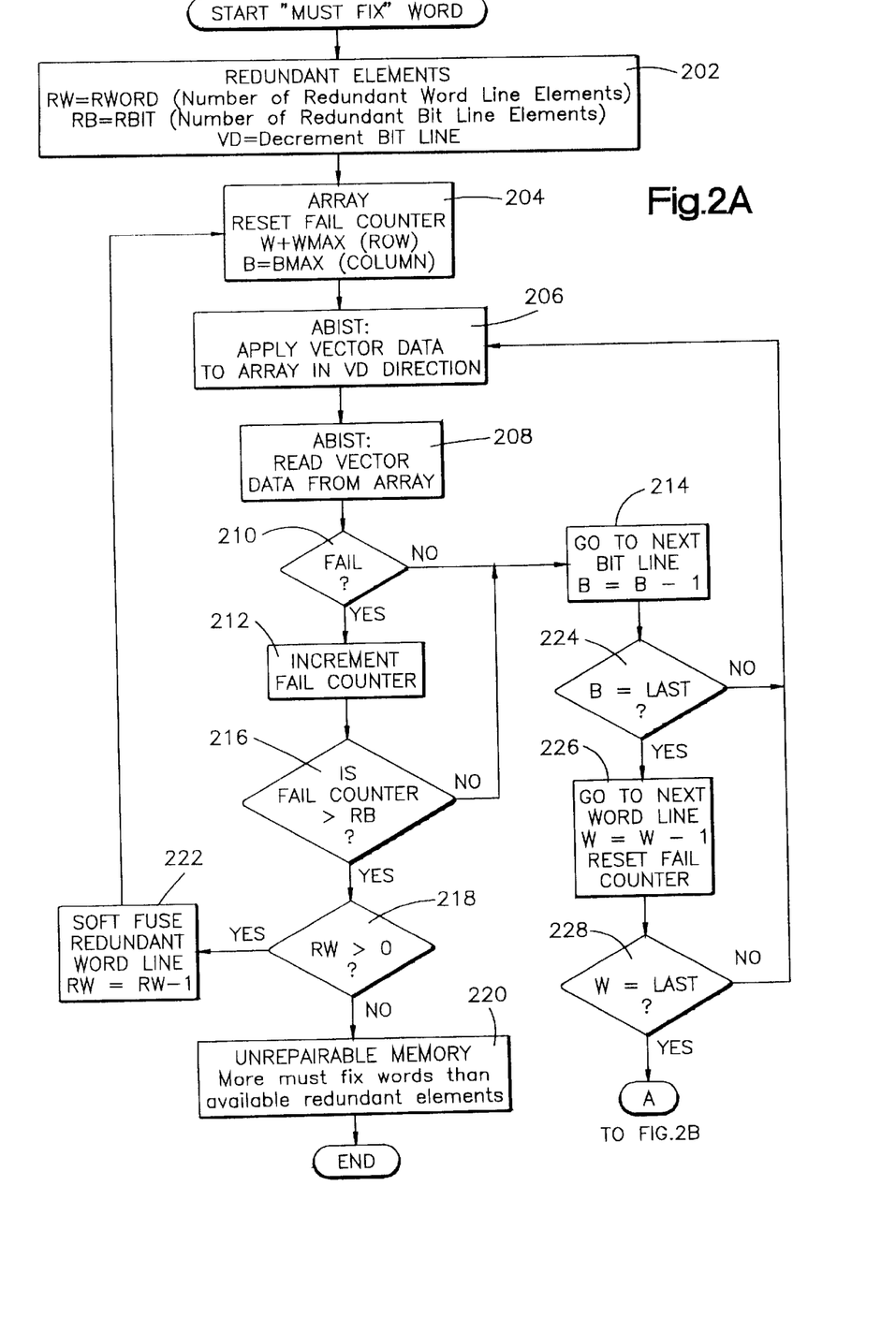
FIGS. 2A and 2B are flowcharts illustrating the "must fix" logic procedure of the present invention.
Figure 2B:
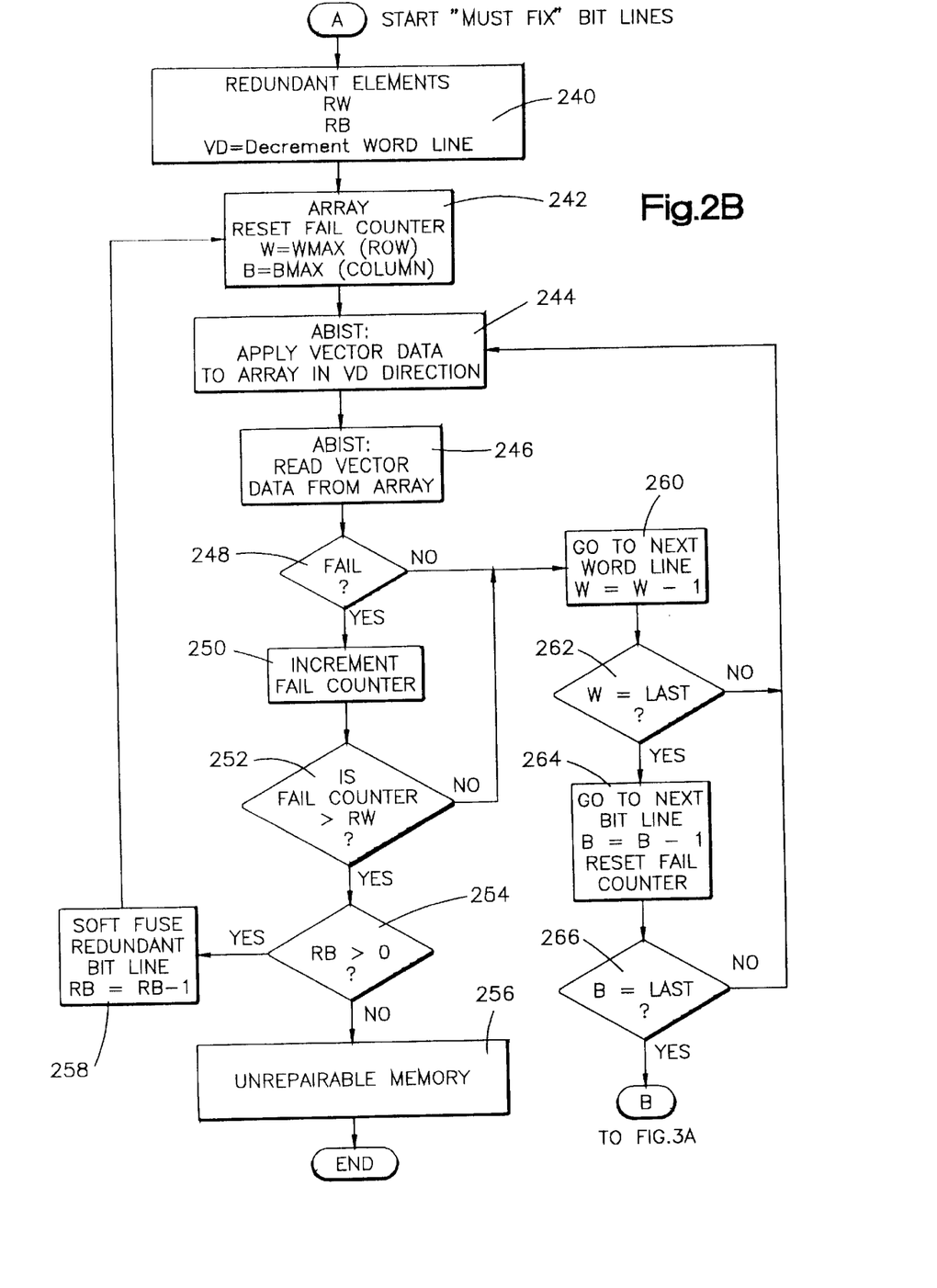

Referring now to FIGS. 2A and 2B, the "must fix" word and bit line logic of the present invention is illustrated. In particular, FIG. 2A illustrates "must fix" word line logic and FIG. 2B illustrates "must fix" bit line logic. Referring now to FIG. 2A in particular, the logic starts in step 202 where a number of system variables are defined. In particular, the vector direction variable "VD" defines the direction (i.e., either incrementing or decrementing) and the low order addressing dimension being tested (i.e., either the bit line or word line dimension). For purposes of the present discussion, it will be assumed that the vector direction VD is in the decrementing bit line direction. While the illustrated embodiment will be described with respect to the decrementing bit line direction, it should be noted that other directions and dimensions can also be chosen such as, for example, incrementing bit line, decrementing word line, and incrementing word line. The variables "RW" and "RB" represent the number of redundant word line and bit line elements, respectively. The number of redundant word line RW and bit line RB elements may be small or large, depending on design requirements. Accordingly, after step 202, the logic proceeds to step 204.

In step 204, a fail counter is reset to an initial value (e.g., zero) and variables representing word lines "W" and bit lines "B" are set to the maximum number of each in the memory array i.e., "WMAX" and "BMAX," respectively. As will be described more fully, the fail counter is responsible for counting the number of failed memory elements along a particular test vector direction and dimension. After step 204, the logic proceeds to step 206 where the ABIST circuit 102 generates and applies test vector data to the memory array 104 in the "VD" vector direction. The generation and application of test vector data by the ABIST circuit 102 is conventional. Following step 206, the logic advances to step 208 where the ABIST circuit 102 reads the output data generated by the test vector data from the memory array 104. In step 210, the output of the memory array 102 is compared with an expected result based on the applied test vectors to determine whether or not the particular cell being tested passed or failed.

If, in step 210, the memory cell failed the test, the logic advances to step 212 where the fail counter is incremented to indicate that a failed memory cell in the present word line has been detected. After step 212, the logic advances to step 216 were the fail counter value is tested to determine whether it is greater than the number of redundant bit lines RB. If the fail counter value is not greater than the number of redundant bit lines RB, the logic advances to step 214 where the next memory cell to be tested (i.e., next bit in the current word line) is designated. If the fail counter value is greater than the number of redundant bit lines, the logic advances to step 218 and tests whether any redundant word lines are available for soft-fusing. If no redundant word lines are available, the logic advances to step 220 where an indication is generated which indicates that the memory is not repairable due to the lack of available redundant word lines. However, if a redundant word line is available, the logic advances to step 222 where a redundant word line is soft-fused to repair the failed memory cells. After step 222, the logic loops back to step 204 and restarts testing of the entire memory array since the redundant word line may itself have failed elements. Alternatively, testing could resume at the replaced word line address if no interactions are anticipated.

However, if in step 210 it is determined that the memory cell under test is not defective, the logic advances to step 214 where the next memory cell to be tested is designated. Following step 214, the logic advances to step 224 to determine whether the last bit line (i.e., last memory cell) in the current word line has been tested. If the last bit line in the current word line has not been tested, the logic loops back to step 206 where the ABIST circuit applies the test vector data to the next bit line (i.e., next memory cell). However, if the last bit line ("B=LAST") in the current word line has been tested, the logic then proceeds to step 226 where the bit lines (i.e., memory cells) in the next word line are designated for testing in the current vector direction and dimension. Also in step 226, the fail counter value is reset to its initial value (e.g., zero). After step 226, the logic advances to step 228 where it tests to determine whether the last word line ("W=LAST") in the memory array has been tested. If the last word line in the memory array has not been tested, then the logic loops back to step 206 where the ABIST circuit applies test vector data to the next word line. However, if the last word line in the memory array has been tested, the logic advances to step 240 in FIG. 2B where the testing sequence will restart, but this time in the decrementing word line direction and dimension.

Referring now to FIG. 2B, "must fix" bit line logic is illustrated. The logic starts in step 240 where a number of system variables are defined. In particular, the vector direction variable "VD" is defined to be either in the decrementing word line direction and dimension. The variables "RW" and "RB" represent the number of remaining redundant word line and bit line elements, respectively and are carried over from the "must fix" logic of FIG. 2A. Also as described above, the number of these elements may be small or large, depending on design requirements. Accordingly, after step 240 the logic proceeds to step 242.

In step 242, a fail counter is reset to an initial value (e.g. zero) and variables representing word lines "W" and bit lines "B" are set to the maximum number of each in the memory array i.e., "WMAX" and "BMAX," respectively. The fail counter now represents the number of failed memory word line elements in a particular bit line. After step 242, the logic proceeds to step 244 where the ABIST circuit 102 generates and applies test vector data to the memory array 104 in the VD vector direction and dimension. Following step 244, the logic advances to step 246 where the ABIST circuit 102 reads the output data generated by the test vector data from the memory array 104. In step 248, the output of the memory array 102 is compared with an expected result based on the applied test vectors to determine whether or not the particular cell being tested passed or failed.

If, in step 248, the memory cell failed the test, the logic advances to step 250 where the fail counter is incremented. After step 250, the logic advances to step 252 were the fail counter value is tested to determine whether it is greater than the number of redundant word lines RW. If the fail counter value is not greater than the number of redundant word lines RW, the logic advances to step 258 where the next memory cell to be tested (i.e., next word line in the current bit line) is designated. If the fail counter value is greater than the number of redundant word lines, the logic advances to step 254 and tests whether any redundant bit lines are available for soft-fusing. If no redundant bit lines are available, the logic advances to step 256 where an indication is generated which indicates that the memory is not repairable due to the lack of available redundant bit lines. However, if a redundant bit line is available, the logic advances to step 258 where a redundant bit line is soft-fused to repair the failed memory cell. After step 258, the logic loops back to step 242 and restarts testing of the entire memory array since the redundant word line may itself have failed elements.

However, if in step 248 it is determined that the memory cell under test is not defective, the logic advances to step 260 where the next memory cell to be tested is designated. Following step 260, the logic advances to step 262 where it tests to determine whether the last word line (i.e., last memory cell) in the current bit line has been tested. If the last word line in the current bit line has not been tested not, the logic loops back to step 244 where the ABIST circuit applies the test vector data to the next word line (i.e., next memory cell). However, if the last word line "W=LAST" in the current bit line has been tested, the logic then proceeds to step 264 where the word lines (i.e., memory cells) in the next bit line are designated for testing in the current vector direction and dimension. Also in step 226, the fail counter value is reset to its initial value (e.g., zero). After step 264, the logic advances to step 266 where it tests to determine whether the last bit line ("B=LAST") in the memory array has been tested. If the last bit line in the memory array has not been tested, then the logic loops back to step 244 where the ABIST circuit applies the test vector data to the word lines in the next bit line. However, if the last bit line in the memory array has been tested, the logic advances to step 302 in FIG. 3A to initiate the "single cell" repair logic.

Figure 3A:
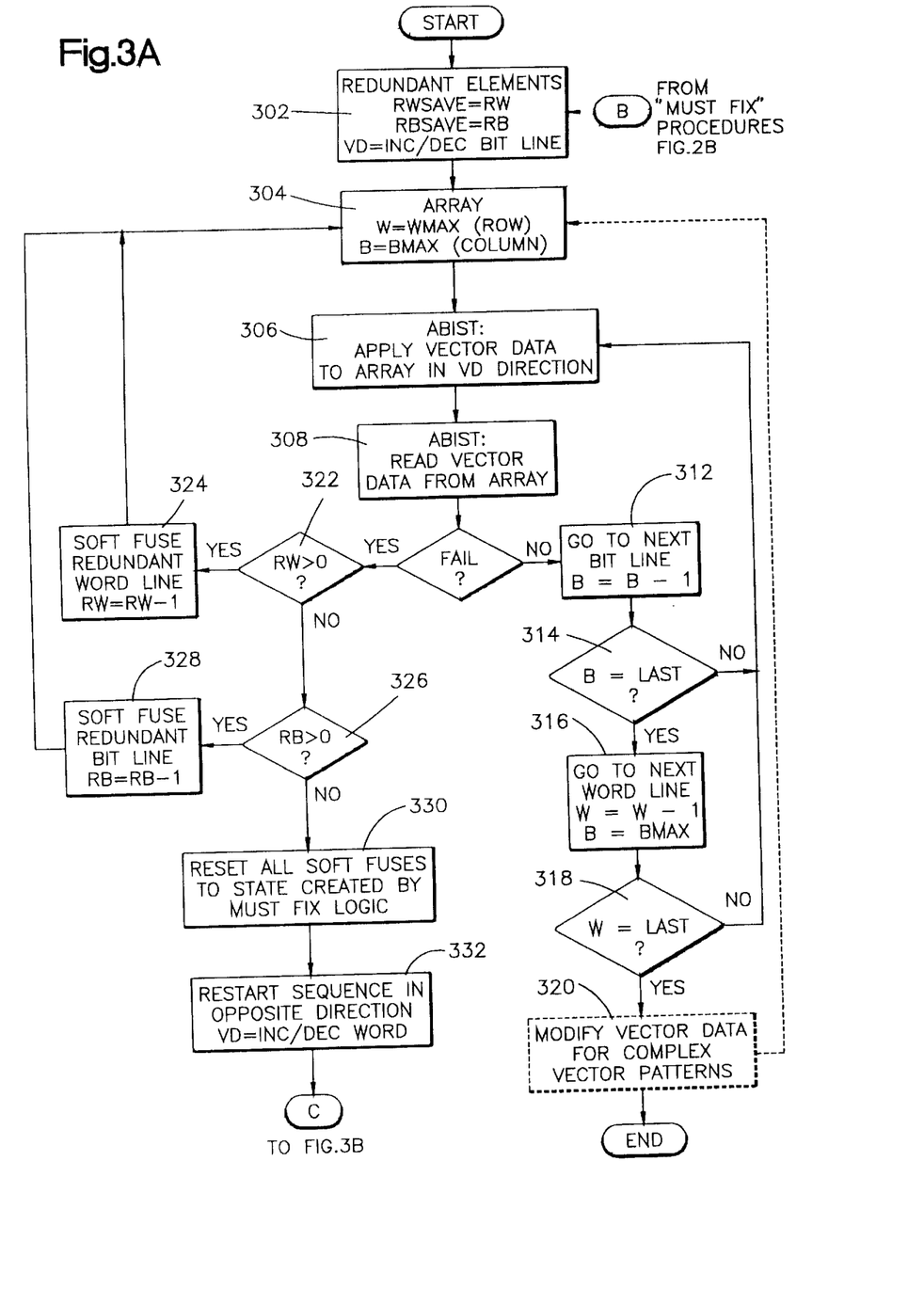
FIGS. 3A and 3B are flowcharts illustrating the "single cell" repair logic of the present invention.
Figure 3B:
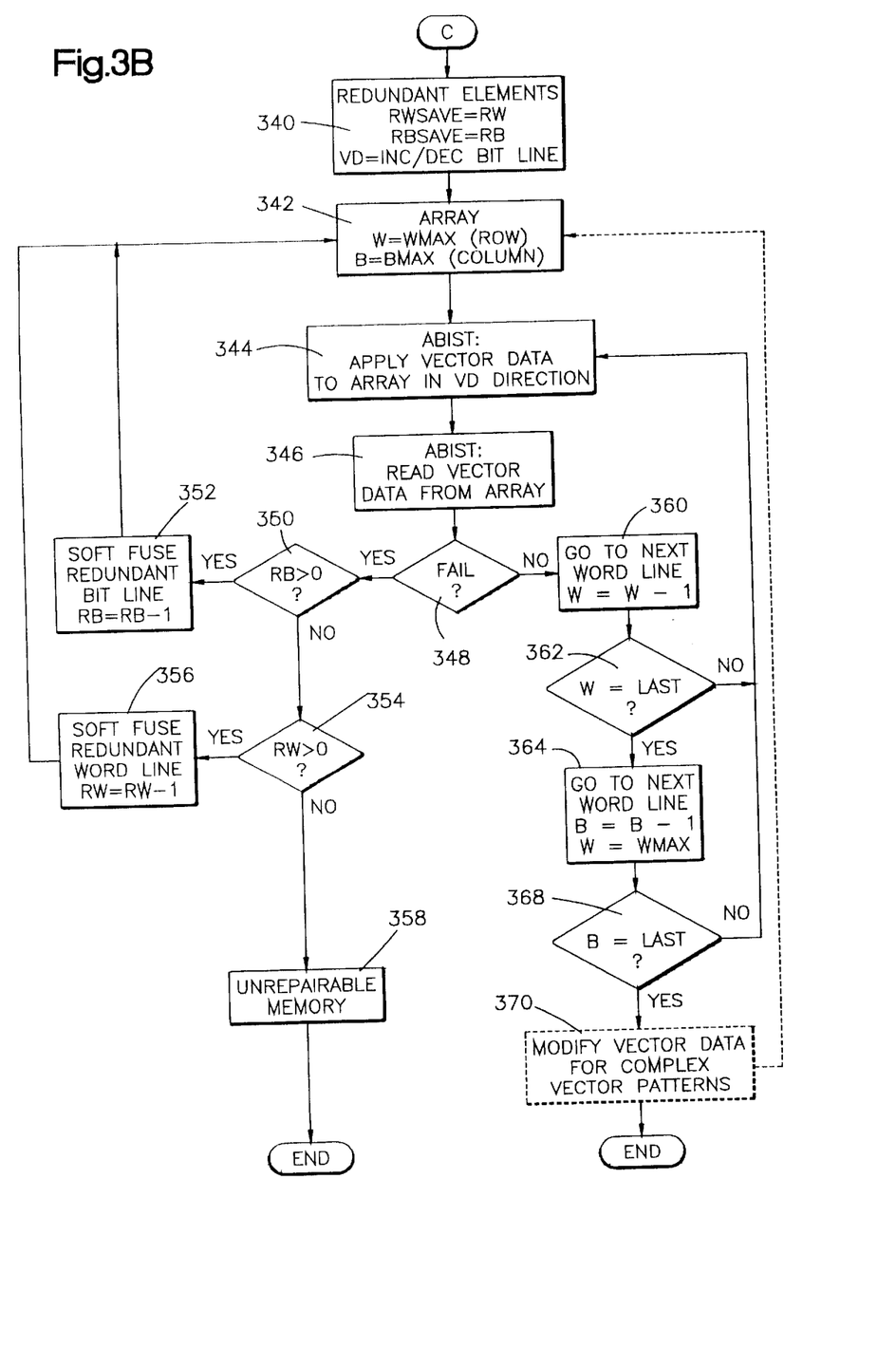

Referring now to FIGS. 3A and 3B, a flowchart illustrating the "single cell" repair logic of the present invention is shown. Referring now specifically to FIG. 3A, the "single cell" repair logic commences in step 302 where a number of system variables are defined. In particular, the vector direction variable "VD" is defined to be in the decrementing bit line direction and dimension. As was described above, other directions and dimensions can also be chosen such as, for example, incrementing bit line, decrementing word line, and incrementing word line. The variables "RW" and "RB" represent the number of remaining redundant word line and bit line elements, respectively, and are carried over from the results of the "must fix" logic of FIGS. 2A and 2B. These values are also saved in "RWSAVE" and "RBSAVE" for possible future processing. Accordingly, after step 302 the logic proceeds to step 304.

In step 304, the variables representing word lines "W" and bit lines "B" are set to the maximum number of each in the memory array i.e., "WMAX" and "BMAX," respectively. After step 304, the logic proceeds to step 306 where the ABIST circuit 102 generates and applies test vector data to the memory array 104 in the VD vector direction. Following step 306, the logic advances to step 308 where the ABIST circuit 102 reads the output data generated by the test vector data from the memory array 104. In step 310, the output of the memory array 102 is compared with an expected result based on the applied test vectors to determine whether or not the particular cell being tested passed or failed.

If in step 310 the memory cell failed the test, then the logic advances to step 322 to determine whether there are any redundant word lines available for soft-fusing to replace the word line of the failed memory cell. If a redundant word line is available (i.e., RW>0), then the logic advances to step 324 where the redundant word line is soft-fused in place of the word line of the failed memory cell and the available number redundant word lines is decremented. If, however, no redundant word lines are available (i.e., RW=0), then the logic advances to step 326 where it tests to see if any redundant bit lines are available to replace the bit line of the failed memory cell. If a redundant bit line is available (i.e., RB>0), then the logic advances to step 328 where the redundant bit line is soft-fused in place of the bit line of the failed memory cell. After either step 324 or 328, the logic loops back to step 304 and restarts testing of the entire memory array because the soft-fused redundant memory lines may themselves have failed elements which would require replacement.

However, if in step 326 no redundant bit lines are available (i.e., RB=0), then the logic advances to step 330 where all of the soft-fuse elements are reset to the states identified by the "must fix" logic of FIGS. 2A and 2B. Step 330 indicates that all of the redundant elements have been exhaustive without completely repairing the memory array in the current vector direction and dimension. After step 330, the logic advances to step 332, in FIG. 3B, where the testing sequence is again executed except in the second dimension (i.e., VD=incrementing or decrementing word line.) A flag is also set in step 332 to indicate that the testing sequence has already been applied in a first vector direction and dimension. The second dimension testing sequence is illustrated in FIG. 3B.

If in step 310, however, the memory cell passed the test, the logic advances to step 312 where the next memory cell to be tested is designated. In particular, since the current vector direction and dimension is in the decrementing bit line dimension, the logic will point to the next memory cell (i.e., next bit line) in the current word (i.e., B=B-1). After step 312, the logic advances to step 314 and tests to determine whether the last bit line in the current word line has been tested. If the last bit line in the current word line has not been tested, the logic loops back to step 306 where the ABIST circuit applies the test vector data to the next bit line. However, if the last bit line ("B=LAST") in the current word line has been tested, the logic then proceeds to step 316 where the memory cells in the next word line are designated for testing. After step 316, the logic advances to step 318 where it tests to determine whether the last word line ("W=LAST") in the memory array has been tested. If the last word line in the memory array has not been tested, then the logic loops back to step 306 where the ABIST circuit applies the test vector data to the bit lines in the next word line. However, if the last word line in the memory array has been tested, the logic may either advance to step 320 or end, as needed based on design criteria. In step 320, the logic modifies the test vector data for complex vector patterns such as, for example, surround or N squared address sequences and then loops back to step 304 to apply such complex vector patterns to further test the memory array.

The "single cell" repair logic advances to step 332 if all redundant memory elements (i.e., redundant word and bit lines) have been exhausted while testing in the first dimension (e.g., bit line) without completely repairing the memory array. Accordingly, since successful repair of the memory array could not be accomplished via redundancy calculations in the first dimension, the "single cell" repair logic restarts testing of the memory array applying repairs in the opposite direction (i.e., utilizing redundant bit lines first through to redundant word lines).

Referring now specifically to FIG. 3B, the logic commences in step 340 where the system variables are reset or redefined. In particular, the vector direction variable VD is now defined to be in the decrementing word line direction and dimension. As previously described, the variables "RW" and "RB" represent the number of redundant word line and bit line elements, restored to their values after the "must fix" logic contents of "RWSAVE" and "RBSAVE," respectively, of FIGS. 2A. and 2B. The number of these elements may be small or large, depending on design requirements and depending on the results of the "must fix" logic processing. Accordingly, after step 340 the logic proceeds to step 342.

In step 342, the variables representing word lines "W" and bit lines "B" are set to the maximum number of each in the memory array i.e., "WMAX" and "BMAX," respectively. After step 342, the logic proceeds to step 344 where the ABIST circuit 102 generates and applies test vector data to the memory array 104 in the VD vector direction. Following step 344, the logic advances to step 346 where the ABIST circuit 102 reads the output data generated by the test vector data from the memory array 104. In step 348, the output of the memory array 102 is compared with an expected result based on the applied test vectors to determine whether or not the particular cell being tested passed or failed.

If in step 348 the memory cell failed the test, then the logic advances to step 350 to determine whether there are any redundant bit lines available for soft-fusing to replace the bit line of the failed memory cell. If a redundant bit line is available (i.e., RB>0), then the logic advances to step 352 where the redundant bit line is soft-fused in place of the bit line of the failed memory cell and the available number redundant bit lines is decremented. If, however, no redundant bit lines are available (i.e., RB=0), then the logic advances to step 354 where it tests to see if any redundant word lines are available to replace the word line of the failed memory cell. If a redundant word line is available (i.e., RW>0), then the logic advances to step 356 where the redundant word line is soft-fused in place of the bit line of the failed memory cell. After either step 352 or 356, the logic loops back to step 342 and restarts testing of the entire memory array because the soft-fused redundant memory lines may themselves have failed elements which would require replacement.

However, if in step 354 no redundant word lines are available (i.e., RW=0), then the logic advances to step 358 where an indication is generated which indicates that the memory is not repairable. This indication may take the form of a displayed message to a user or an entry into a database for purposes of, for example, test analysis or quality control. This indication signifies that all of the redundant elements have been exhaustive without completely repairing the memory array in the second vector direction and, therefore, the memory array is not repairable with the current number of redundant elements.

If in step 348, however, the memory cell passed the test, the logic advances to step 360 where the next memory cell to be tested is designated. In particular, since the current vector direction is presently in the decrementing word line dimension, the logic will point to the next memory cell (i.e., next word line) in the current bit line (i.e., W=W−1). After step 360, the logic advances to step 362 where it tests to determine whether the last word line (i.e., last memory cell) in the current bit line has been tested. If the last word line in the current bit line has not been tested, the logic loops back to step 344 where the ABIST circuit applies the test vector data to the next word line. However, if the last word line in the current bit line has been tested, the logic than proceeds to step 364 where the memory cells (i.e., word lines) in the next bit line are designated for testing. After step 364, the logic advances to step 368 where it tests to determine whether the last bit line ("B=LAST") in the memory array has been tested. If the last bit line in the memory array has not been tested, then the logic loops back to step 344 where the ABIST circuit applies the test vector data to the word lines in the next bit line. However, if the last bit line in the memory array has been tested "B=LAST," the logic may either advance to step 370 or end, as needed based on design criteria. In step 370, the logic modifies the test vector data for complex vector patterns such as, for example, surround or N squared address sequences and then loops back to step 344 to apply such complex vector patterns to further test the memory array.

While the present invention has been illustrated by the description of embodiments thereof, and while the embodiments have been described in considerable detail, it is not the intention of application to restrict or in any way limit the scope of the appended claims to such detail. Additional advantages and modifications will readily appear to those skilled in the art. For example, test vector directions and dimensions may be modified, simple and complex vector test patterns may be applied to the memory array, and the logic of the present invention may be applied in modules rather than as a unitary whole. Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. A method for performing dynamic, two-dimensional redundancy determinations to test and repair a memory cell array having a plurality of first and second dimensional memory components and plurality of redundant first and second dimensional memory components, without collection of significant amounts of fail data, the method comprising the steps of:

(a) determining the number of failed first dimensional memory components having a particular second dimensional memory component;

(b) determining whether the number of failed first dimensional memory components is greater than the number of redundant first dimensional memory components;

(c) if the number of failed first dimensional memory components is greater than the number of redundant first dimensional memory components, then immediately without any further testing, soft-fusing a redundant second dimensional memory component for the particular second dimensional memory component;

(d) determining the number of failed second dimensional memory components having a particular first dimensional memory component;

(e) determining whether the number of failed second dimensional memory components is greater than the number of redundant second dimensional memory components; and (f) if the number of failed second dimensional memory components is greater than the number of redundant second dimensional memory components, then immediately without any further testing, soft-fusing a redundant first dimensional memory component for the particular first dimensional memory component.

2. The method of claim 1 after step (f) comprising the steps of:

(a) along a first dimensional component, determining whether any particular single memory cell is a failed memory cell;

(b) determining whether there is any redundant first dimensional memory components or a second dimensional memory component available for soft-fusing; and (c) if any particular single memory cell is determined to be a failed memory cell, soft-fusing a redundant first or second dimensional memory component for the failed memory cell's first or second dimensional memory component.

3. The method of claim 2 wherein step (b) thereof comprises first determining whether any redundant second dimensional memory components are available for soft-fusing.

4. The method of claim 3 further comprising the step of determining whether any redundant first dimensional memory components are available for soft-fusing if it is determined that no redundant second dimensional memory components are available for soft-fusing.

5. The method of claim 4 further comprising the step of soft-fusing a redundant first dimensional memory component for the failed memory cell's first dimensional memory component.

6. The method of claim 2 further comprising the step of restoring the state of a soft-fused redundant memory element to a previously determined state if it is subsequently determined that there are no available redundant first and second dimensional memory components.

7. The method of claim 6 further comprising the steps of:
   (a) along a second dimensional component, determining whether any particular single memory cell is a failed memory cell; and
   (b) if any particular single memory cell is determined to be a failed memory cell, soft-fusing a redundant first dimensional memory component for the failed memory cell's first dimensional memory component.

8. A method for performing dynamic, two-dimensional redundancy determinations to test and repair a memory cell array having a plurality of first and second dimensional memory components and a plurality of redundant first and second dimensional memory components, the method comprising the steps of:
   (a) generating vector test data which corresponds to an expected memory array output;
   (b) applying the vector test data to the memory array;
   (c) reading memory array output data which is associated with the applied vector test data;
   (d) determining if a fail memory cell is present in the memory array by comparing the expected memory array output with the read memory array output;
   (e) if a fail memory cell is present, identifying first and second dimensional memory components of the fail memory cell;
   (f) determining if a redundant first dimensional component is available;
   (g) if a redundant first dimensional component is available, immediately before any further testing, replacing the identified first dimensional component with a redundant first dimensional component;
   (h) if a redundant first dimensional component is not available, determining if a redundant second dimensional component is available; and
   (i) if a redundant second dimensional component is available, immediately before any further testing, replacing the identified second dimensional component with a redundant second dimensional component.

9. The method of claim 8 further comprising the step of applying the vector test data to the memory array after a redundant dimensional component has replaced a dimensional component of a fail memory cell.

10. The method of claim 8 wherein steps (g) and (i) comprise the step of soft-fusing a redundant dimensional component.

11. The method of claim 10 further comprising the step of restoring the state of a soft-fused steering of redundant memory elements to a previously determined state if it is determined that there are no available redundant first and second dimensional memory components and a fail memory cell exists.

12. The method of claim 11 further comprising the steps of:
   (a) generating vector test data which corresponds to an expected memory array output;
   (b) applying the reverse vector test data to the memory array; and
   (c) reading memory array output data which is associated with the applied reverse vector test data.

13. A memory device for use in a computer, the device comprising:
   (a) a plurality of memory cells having a plurality of first and second dimensional memory components;
   (b) a plurality of redundant first and second dimensional memory components;
   (c) dynamic, two-dimensional redundancy logic for testing and repairing the plurality of memory cells; the logic comprising:
      (1) logic for determining the number of failed first dimensional memory components having a particular second dimensional memory component;
      (2) logic for determining whether the number of failed first dimensional memory components is greater than the number of redundant first dimensional memory components;
      (3) logic for immediately before any further testing, soft-fusing a redundant second dimensional memory component for the particular second dimensional memory component if the number of failed first dimensional memory components is greater than the number of redundant first dimensional memory components;
      (4) logic for determining the number of failed second dimensional memory components having a particular first dimensional memory component;
      (5) logic for determining whether the number of failed second dimensional memory components is greater than the number of redundant second dimensional memory components; and
      (6) logic for immediately before any further testing, soft-fusing a redundant first dimensional memory component for the particular first dimensional memory component if the number of failed second dimensional memory components is greater than the number of redundant second dimensional memory components.

14. The device of claim 13 further comprising:
   (a) logic for determining along a first dimensional component after the logic in step (6) is finished whether any particular single memory cell is a failed memory cell;
   (b) logic for determining whether there is any redundant first dimensional memory component or a second determined memory component available for soft-fusing; and
   (c) logic for soft-fusing a redundant first or second dimensional memory component for the failed memory cell's second dimensional memory component if any particular single memory cell is determined to be a failed memory cell.

15. The device of claim 14 wherein the logic of the thrust is logic for determining whether any redundant second dimensional memory components are available for soft-fusing.

16. The device of claim 15 further comprising logic for determining whether any redundant first dimensional memory components are available for soft-fusing if it is determined that no redundant second dimensional memory components are available for soft-fusing.

17. The device of claim 16 further comprising logic for soft-fusing a redundant first dimensional memory component for the failed memory cell's first dimensional memory component.

18. The device of claim 17 further comprising logic for restoring the state of a soft-fused redundant memory element to a previously determined state if it is subsequently determined that there are no available redundant first and second dimensional memory components.

19. The device of claim 18 further comprising:
(a) logic for determining along a second dimensional component whether any particular single memory cell is a failed memory cell; and
(b) logic for soft-fusing a redundant first dimensional memory component for the failed memory cell's first dimensional memory component if any particular single memory cell is determined to be a failed memory cell.

20. The device of claim 13 further comprising logic for generating an indication that the memory is not repairable.

* * * * *

UNITED STATES PATENT AND TRADEMARK OFFICE
CERTIFICATE OF CORRECTION

| | |
|---|---|
| PATENT NO. : 6,073,258 | Page 1 of 1 |
| DATED : June 6, 2000 | |
| INVENTOR(S) : Wheater | |

It is certified that error appears in the above-identified patent and that said Letters Patent is hereby corrected as shown below:

Claims

Column 11,
Line 59, after "soft-fused" delete "steering of";
Line 60, after "memory" change "elements" to -- element --.

Signed and Sealed this

Seventh Day of August, 2001

*Attest:*

Nicholas P. Godici

NICHOLAS P. GODICI
*Attesting Officer*   *Acting Director of the United States Patent and Trademark Office*